(12) United States Patent
Chowdhury et al.

(10) Patent No.: US 11,443,983 B2
(45) Date of Patent: Sep. 13, 2022

(54) VOID-FREE HIGH ASPECT RATIO METAL ALLOY INTERCONNECTS AND METHOD OF MANUFACTURE USING A SOLVENT-BASED ETCHANT

(71) Applicant: Intel Corporation, Santa Clara, CA (US)

(72) Inventors: Shaestagir Chowdhury, Portland, OR (US); Sirikarn Surawanvijit, Portland, OR (US); Biswadeep Saha, Beaverton, OR (US); Erica J. Thompson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 843 days.

(21) Appl. No.: 16/139,241

(22) Filed: Sep. 24, 2018

(65) Prior Publication Data

US 2020/0098626 A1 Mar. 26, 2020

(51) Int. Cl.
*H01L 21/768* (2006.01)
*H01L 21/3213* (2006.01)
*H01L 23/532* (2006.01)
*C22C 19/03* (2006.01)
*C22C 19/07* (2006.01)
*H01L 23/522* (2006.01)
*C09K 13/00* (2006.01)

(52) U.S. Cl.
CPC ........ *H01L 21/76879* (2013.01); *C22C 19/03* (2013.01); *C22C 19/07* (2013.01); *H01L 21/32134* (2013.01); *H01L 21/76843* (2013.01); *H01L 23/5226* (2013.01); *H01L 23/53261* (2013.01); *C09K 13/00* (2013.01)

(58) Field of Classification Search
CPC ......... H01L 21/76879; H01L 21/32134; H01L 21/76843; H01L 23/5226; H01L 23/53261; H01L 21/76877; H01L 21/76883; H01L 23/53209; C22C 19/03; C22C 19/07; C09K 13/00
See application file for complete search history.

(56) References Cited

U.S. PATENT DOCUMENTS 6,645,853 B1 * 11/2003 Ngo ................. H01L 23/53238
  257/E23.145
2017/0018506 A1 * 1/2017 Cao ................... H01L 21/76843
2017/0179238 A1 * 6/2017 Cheng ................. H01L 29/1608

\* cited by examiner

*Primary Examiner* — Robert G Bachner
(74) *Attorney, Agent, or Firm* — Schwabe, Williamson & Wyatt, P.C.

(57) ABSTRACT

An integrated circuit structure comprises a dielectric layer on a substrate. An open structure is in the dielectric layer, and a void-free metal-alloy interconnect is formed in the open structure, wherein the void-free metal-alloy interconnect comprise a metal-alloy comprising a combination of two or more metallic elements excluding any mixing effects of a seed layer or liner deposited in the open structure prior to a metal fill material, and excluding effects of any doping material on the metal fill material.

7 Claims, 10 Drawing Sheets

VOID-FREE HIGH ASPECT RATIO METAL ALLOY INTERCONNECTS AND METHOD OF MANUFACTURE USING A SOLVENT-BASED ETCHANT

TECHNICAL FIELD

Embodiments of the disclosure are in the field of integrated circuit structures and, in particular, void-free high aspect ratio metal alloy interconnects and method of manufacture using a solvent-based etchant.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and state-of-the-art fabrication processes may limit the possibility to further extend them into the sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1:
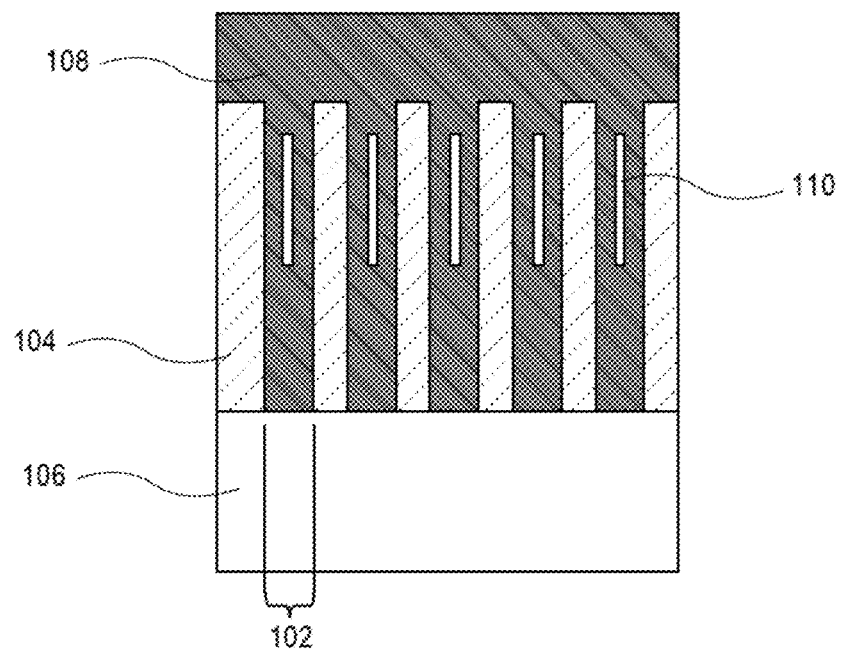
FIG. 1 illustrates a cross-section view of several trenches spaced apart within insulating dielectric layer.

Void-free high aspect ratio metal alloy interconnects are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating void-free, high aspect ratio interconnects comprising metal alloys. Embodiments may include or pertain to integrated circuit structures using interconnects comprised of a metal alloy, rather than simply a metal. Other embodiments may include or pertain to a process for filling high aspect ratio open structures, including trenches and vias, with a metal alloy without void formation using a solvent-based etchant and the chemistry thereof. One or more of these embodiments may be implemented to remove metal alloys across a variety of features with tight WIW (within wafer) control to enable almost any deposition to, such as CVD, electrolysis, or other electrodeposition methods regardless of critical dimension of the features.

Metal interconnects are utilized in the fabrication of integrated circuits as a means of connecting various electronic and semiconductor devices into a global circuitry. For example, BEOL processing may involve depositing various layers of metal and insulating material in the desired pattern. The various metal layers are interconnected by interconnects, which may include a line portion formed on or in a layer to provide an electrical connection between components, and open structures called vias and trenches. The line portion may be formed by etching a trench, which is a deep narrow passage etched into a substrate or in an insulating material, and depositing metal in it. A via (vertical interconnect access) is an electrical connection between layers in an electronic circuit that goes through the plane of one or more adjacent layers. Vias may be formed by etching a small opening in the insulating material and depositing metal in the openings.

As technology nodes extend into the sub-10 nm range, metal interconnects need to be formed in open structures (e.g., trenches and vias) having aspect ratios greater than 5:1 and even greater than 10:1. Such high aspect ratio open structures create several challenges in the formation of metal interconnects. One challenge is that current metallic deposition techniques are incapable of filling high aspect ratio openings without formation of voids or seams in the metal material.

To provide context, FIG. 1 illustrates a cross-section view of several trenches 102 spaced apart within insulating dielectric layer 104 over a substrate 106. Each of the trenches 102 is defined by sidewalls of the dielectric layer 104. Although the trenches 102 are shown with vertical sidewalls, the trenches 102 may not have perfectly vertical sidewalls (e.g., the bottom of the trench width may not be equal to the top width of the trench). After the trenches 102 are etched in the dielectric layer 104, a metal material 108 is deposited in the trenches 102 and over filled. Subsequently, the metal material 108 may be etched or planarized to be level with the surface of the dielectric layer 104. Typically the metal material 108 comprises aluminum, copper, and the like. The dielectric layer 104 may include $SiO_2$, low-K materials, and the like.

For trenches 102 having an aspect ratio greater than 5:1, certain metal fill techniques, such as atomic layer deposition (ALD) and chemical vapor deposition (CVD), result in the formation of voids 110 in the deposited metal material 108. This occurs because the conformal deposition technique (which forms a metal material film on the bottom and sidewalls of the trench simultaneously) closes the width of the trench more quickly than it closes the height of the trenches 102 because physical transport limits film growth rates in high-aspect ratio structures. This problem is exacerbated with increasing aspect ratio (trench height:trench width ratio) trenches and interconnects, which are more and more common with decreasing pitch technologies.

In contrast, one or more embodiments described herein are directed to integrated circuit structure features having high aspect ratio interconnects comprised of a metal alloy, rather than a metal such as copper, without void formation. Applications of such systems may include, but are not limited to, back end (BEOL) logic, memory, or analog applications.

Figure 2:
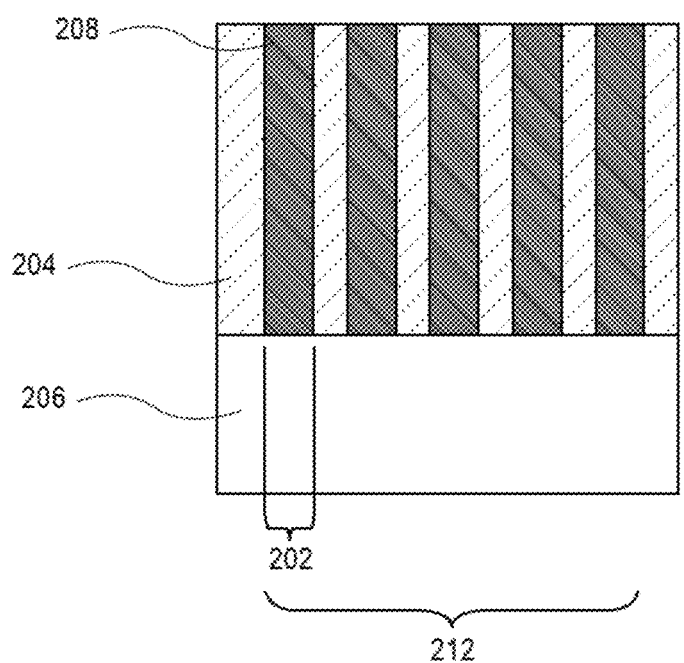
FIG. 2 illustrates a cross-section view of a portion of an integrated circuit in accordance with a first embodiment.

FIG. 2 illustrates a cross-section view of a portion of an integrated circuit in accordance with a first embodiment. Several open structures 202, which include trenches and/or vias, are shown spaced apart within dielectric layer 204 over a substrate 206, where each of the open structures 202 is defined by sidewalls of the dielectric layer 204. The dielectric layer 204 may include $SiO_2$, low-K materials, and the like. After the open structures 202 are etched in the dielectric layer 204, a metal alloy 208 is deposited and processed in a manner that results in void-free metal-alloy interconnects 212 formed in the open structures 202 in accordance with the disclosed embodiments.

In some embodiments, a liner may be deposited in the open structures 202 prior to deposition of the metal alloy 208.

In one embodiment, both open structures 202 and therefore, the void-free metal-alloy interconnects 212, have high-aspect ratios of greater than 5-1. For example, in one embodiment, open structures comprising trenches may have aspect ratio of 5-1 to 7-1, while open structures comprising vias may have an aspect ratio of 12-1 to 20-1 depending on the size of the openings. For example, the top opening of the vias may have a critical dimension less than 50 nm, e.g., 5-50 nm. In terms of heights/depths, in one embodiment trenches may be 50-100 nm tall, while vias may be 100-300 nm tall.

FIGS. 3A-3F illustrate cross-sectional views representing preliminary steps in fabricating an integrated circuit comprising a plurality of void-free metal-alloy interconnects 212. According to a further aspect of the disclosed embodiments, the process includes filling high aspect ratio open structures with a metal alloy without void formation using a solvent-based etchant, as described further below.

Figure 3A:
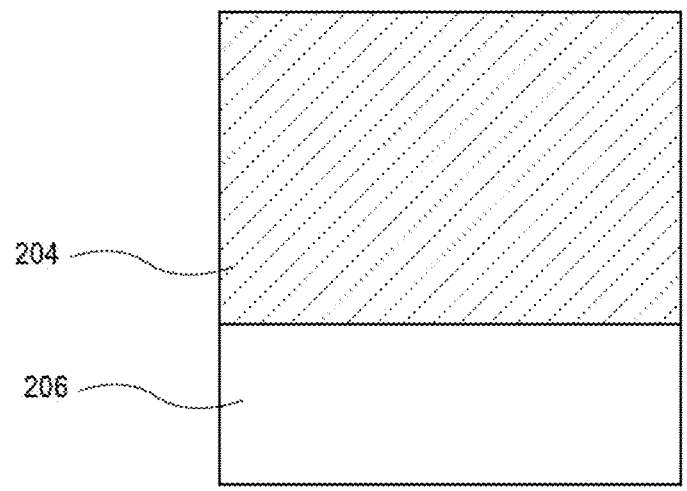
FIGS. 3A-3F illustrate cross-sectional views representing preliminary steps in fabricating an integrated circuit comprising a plurality of void-free metal-alloy interconnects.

FIG. 3A shows that the process for fabricating an integrated circuit comprising a plurality of void-free metal-alloy interconnects may begin with formation of a dielectric layer 204 over a substrate 206. In one embodiment, the dielectric layer 204 may comprise more than one dielectric layer. For example, the substrate 206 may include an array of transistors or other integrated circuits fabricated in a silicon substrate and encased in a dielectric layer (not shown) over which dielectric layer 204 is deposited. The dielectric layer 204 may comprise any material suitable for being patterned by a standard lithography/etch process and which provides a durable base for a plurality of interconnects. In an embodiment, dielectric layer 204 does not significantly contribute to cross-talk between the metal interconnects. In one embodiment, dielectric layer 204 may comprise a low- to mid-K dielectric material. Dielectric layer 204 may be deposited by any suitable technique that provides substantially even coverage of dielectric layer 204 above integrated circuit, such as a spin-on process, a chemical vapor deposition process, or a polymer-based chemical vapor deposition process.

Figure 3B:
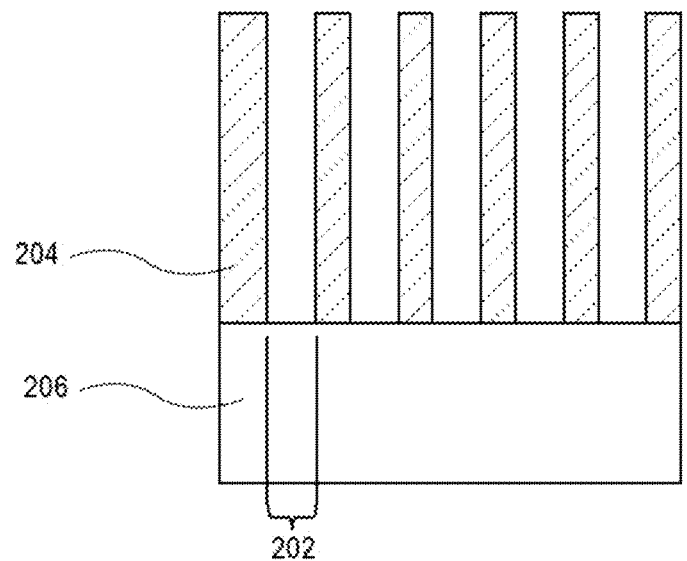

FIG. 3B shows the process after the dielectric layer 204 is patterned to form a series of open structures 202 (e.g., trenches and/or vias) recessed in the dielectric layer 204. The open structures 202 have high aspect ratios. For example, for open structures 202 comprising trenches, the aspect ratio is greater than 5:1 and for open structures 202 comprising vias, the aspect ratio may range from 8:1 to 20:1. The patterning process exposes side wall portions of the dielectric layer 204, which defines the open structures 202. Any number of open structures 202 may be created and adjacent ones of the open structures 202 may be variably spaced and have variable depths in the dielectric layer 204 (e.g., the open structures need not extend to the bottom on the dielectric layer 204).

Figure 3C:
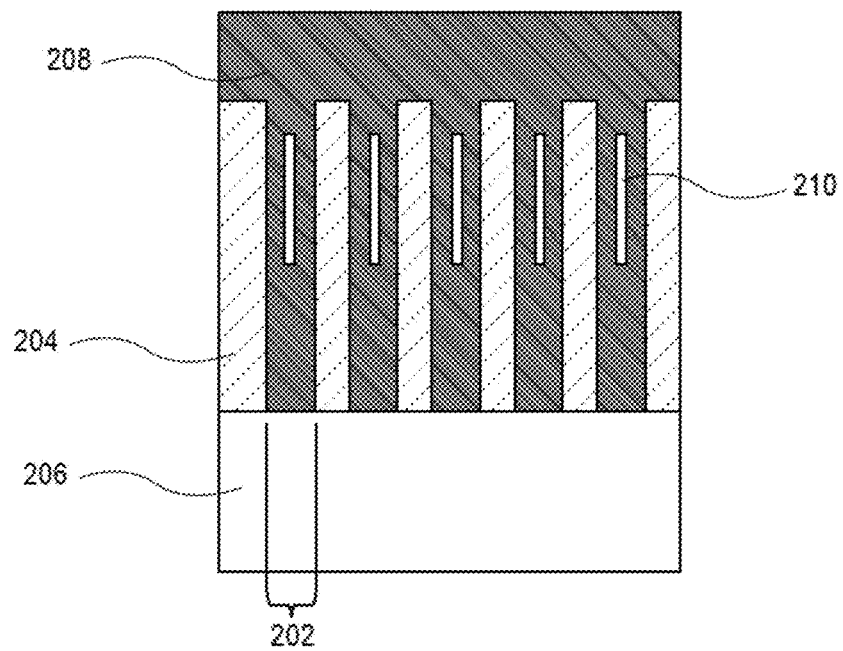

FIG. 3C shows the process after metal alloy 208 is deposited in the open structures 202 such that the metal alloy 208 fills the open structures 202 and also forms an overburden layer over a top surface of the dielectric layer 204, as shown. Due to the high aspect ratio of the open structures 202, the deposition rate on the side walls of the high aspect ratio open structures 202 is much less than at the bottom of the open structures 202, which forms voids 210 in the metal alloy 208.

Figure 3D:
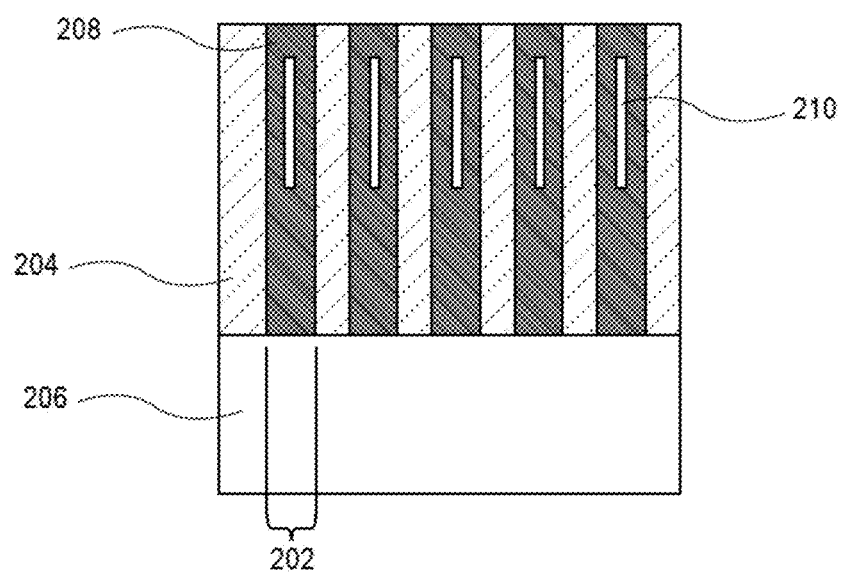

FIG. 3D show the process after the metal alloy 208 overburden is planarized, e.g., via chemical mechanical polishing (CMP), down to the top surface of the dielectric layer 204.

Figure 3E:
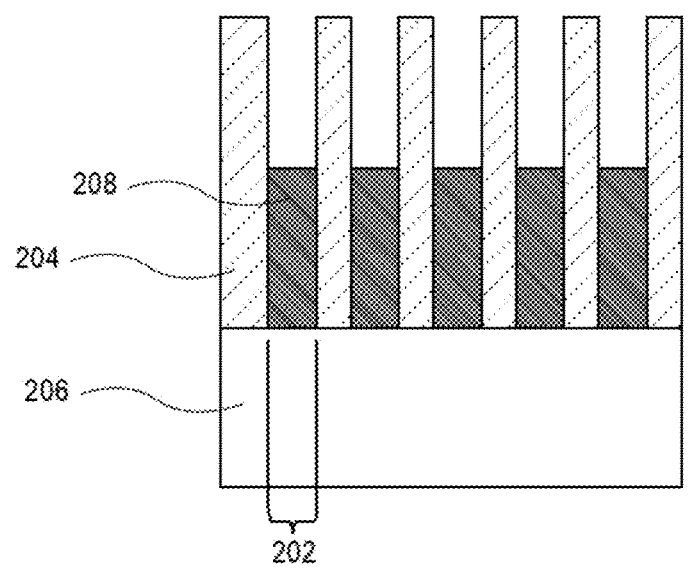

FIG. 3E shows that in accordance with a further aspect of the disclosed embodiments, the void problem is overcome by removal of the voids in the open structures 202 through a post-planarization recess of the metal alloy 208 to a portion of the height of the open structures 202 using a highly selective etchant. The depth at which the metal alloy 208 is removed in the open structures 202 is variable and dependent on the lower depth of the voids.

Figure 3F:
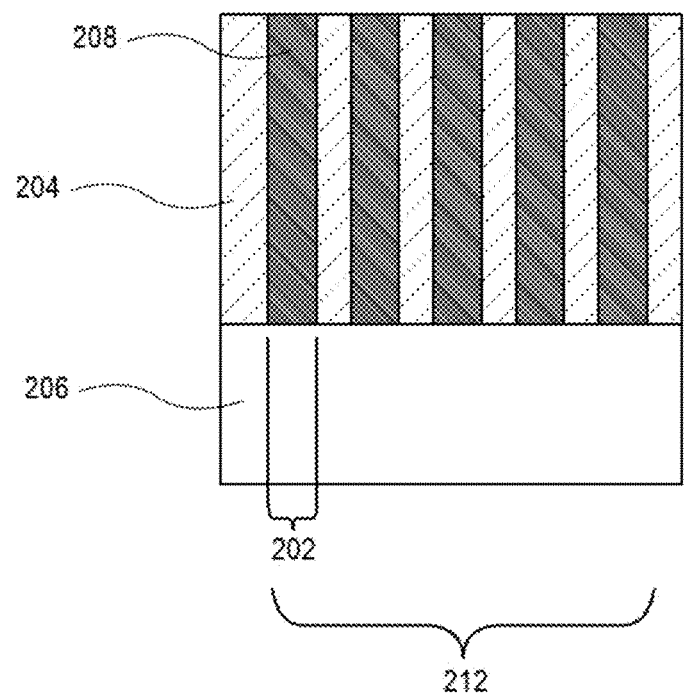

FIG. 3F shows the process after the open structures 202 are refilled with the metal alloy 208, and after the metal alloy-filled open structures 202 are re-planarized to create in high aspect ratio, void-free metal-alloy interconnects 212. Note, the second deposition of the metal alloy 208 in the open structures 202 may result in an overburden layer over a top surface of the dielectric layer 204, as shown in FIG. 3C, prior to the re-planarization.

In accordance with a further aspect of the disclosed embodiments, the process shown in FIGS. 3A-3F may be repeated. That is, the structure shown in FIG. 3F may form a first layer of void-free metal-alloy interconnects 212 and may substitute for the substrate 206 shown in FIG. 3A on which another dielectric layer is deposited with a second set of open structures etched therein. This is followed by filling the second set of open structures with the metal alloy; planarizing the metal alloy filled open structures; recessing the post-planarized metal alloy filled open structures with a selective etchant to remove afforded regions; and refilling and re-planarizing the open structures to form a second layer of void-free metal-alloy interconnects over the first layer. This process may be repeated as many times as desired. In yet a further embodiment, the fabrication process of recessing and refilling multiple times may be used with a conventional metal, such as copper, rather than a metal alloy.

The process for fabricating void-free, high aspect ratio interconnects using a metal alloy, such as nickel-cobalt, has several advantages. Metal alloys have highly advantageous electrical, mechanical, and chemical properties, including superb corrosion resistance, as well as extreme hardness. However, effectively recessing and removing metal alloys across a variety of high aspect ratio structures with tight WIW (within wafer) control poses challenges. For example, conventional wet etchants remove the metal fill too quickly and results in substantial or even complete removal of the metal fill, as well as yielding non-uniform metal fill with high surface roughness.

Figure 4A:
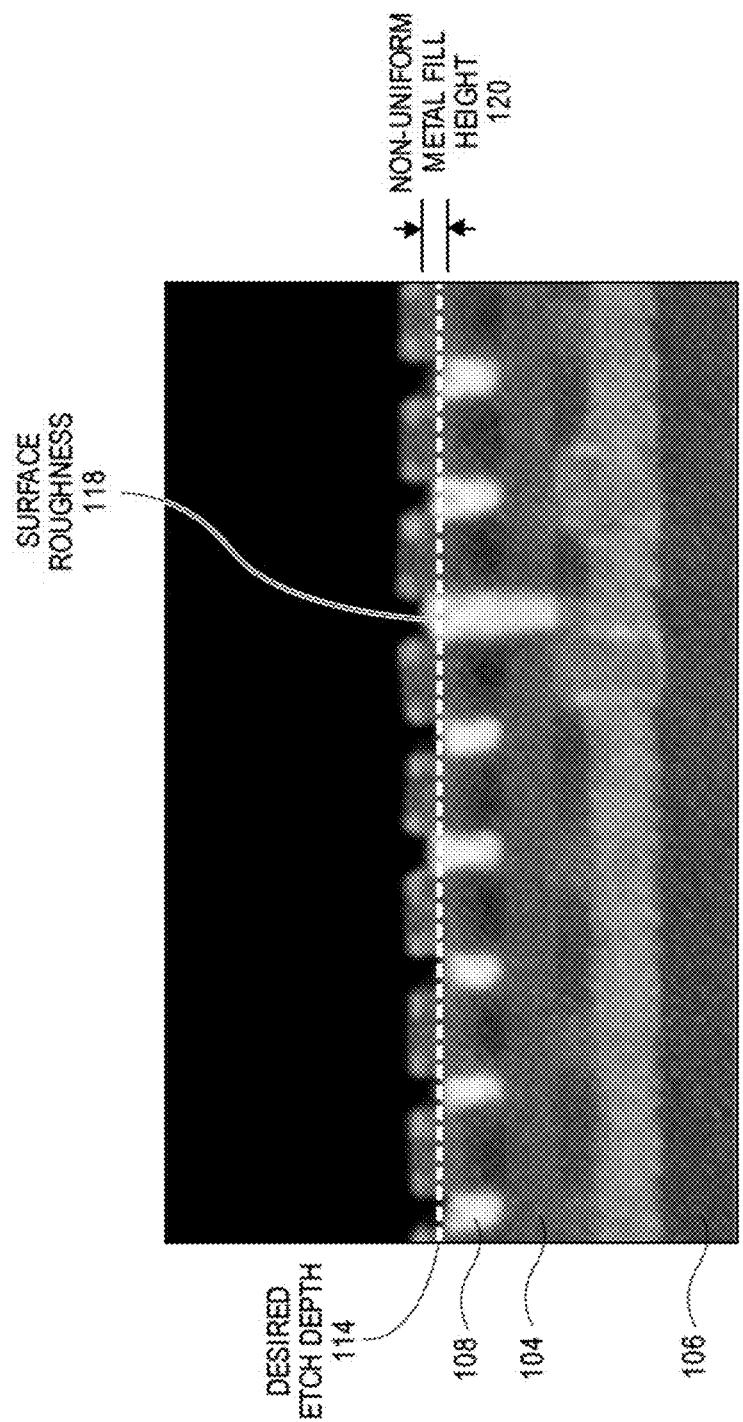
FIG. 4A is a scanning electron microscope (SEM) cross-section image of a metal fill in open structures that has been recessed using a conventional wet etchant.

FIG. 4A is a scanning electron microscope (SEM) cross-section image of a metal fill in open structures that has been recessed using a conventional wet etchant. Trenches formed in dielectric layer 104 over a substrate 106 have been filled with a metal material 108, and recessed using a conventional wet etchant. A conventional wet etchant may be, for example, mono-, di- or tricarboxylic acids or derivatives thereof, citric acid is an example of a particular suitable etchant for selective removal of copper. Wet etchants used to recess metal typically comprise an aqueous mixture of citric acid, including its isomers (isocitric, aconitic, etc.), and similar carboxylic acids (succinic, tartaric, malonic, etc.).

Although such aqueous wet etchants have widely been utilized in various technologies, conventional wet etchants often remove the metal fill too fast. Compared to a desired etch depth 114, wet etch recessing results in non-uniform metal fill height 120 as well as high surface roughness 118. If used in the process of FIGS. 3A-3F, the high surface roughness and uneven metal recess found in narrow (greater than 5:1) features would lead to subsequent opens between the next upper level metal fill and the recessed metal fill. The reason this occurs is because metals are comprised of grains having different sizes and crystal orientations that etch at different rates.

Figure 4B:
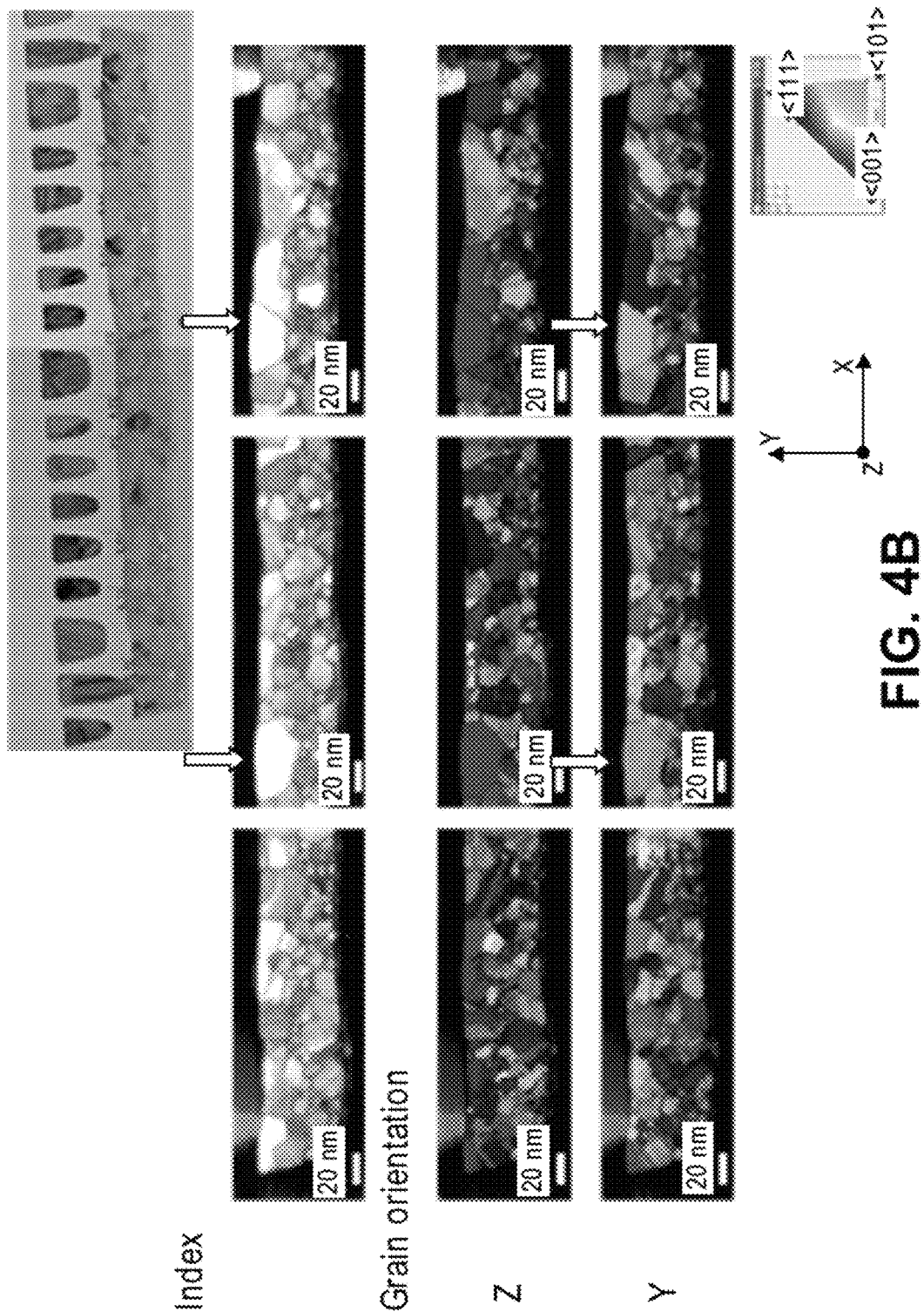
FIG. 4B is a series of transmission electron microscopy (TEM) orientation mapping images depicting grain size and crystal orientations of cobalt.

For example, FIG. 4B is a series of transmission electron microscopy (TEM) orientation mapping images depicting grain size and crystal orientations of cobalt. The top row image is a TEM image showing a cross-section of trenches and vias that are filled with cobalt. Index images show various sizes of grains and crystal orientations of the cobalt from an outer portion of a wafer to the center of the wafer. Cobalt includes large grains having a <111> crystal orientation, and smaller grains having <001> and <101> crystal orientations. Grain orientation images show cross-sections of the grains in the Z-direction and the Y-direction, respectively. The larger grains are etched less than smaller grains. More specifically, conventional etchants that utilize an aqueous mixture of citric acid and peroxide recess large grains with a <111> crystal orientation in growth direction Y less than tiny grains, which are attacked more by the etchant and thus recessed deeper. This is the root cause of both within trench surface roughness and trench-to-trench recess depth variation. Similarly, the aforementioned aqueous solutions also fail to provide uniform cross trench recess depths when recessing metal alloys, such as Ni—Co, rather than metal.

In accordance with a further aspect of the disclosed embodiments, predominantly aqueous wet etchant solutions are replaced mainly with a solvent-based wet etchant, which slowly and controllably settle metal and metal alloys. In one embodiment, the solvent-based etchant comprises citric acid, peroxide (un-stabilized), and approximately 33% of a combination of a solvent comprising a secondary alcohol and minimal aqueous media such as water (as it is required for metallic corrosion) to achieve the desired metal or metal alloy depth within the open structures. In one embodiment, the secondary alcohol is selected from a group comprising: 1,2-propanediol and 1,3 propanediol. Replacing a predominantly aqueous solution mainly with a solvent reduces grain attack during the etching process based upon Poiseuille's Law that defines the physical relationship between Laminar flow and viscosity. Water has a viscosity of 0.0009107 pascal second (Pa·s), whereas 1,2-propanediol has viscosity of 0.042 pascal second (Pa·s).

More specifically, a formula for the solvent-based etchant consists of a combination of approximately 1.0%-2% citric acid, 0.1%-0.5% peroxide, 80%-90% 1,2 propanediol or 1,3 propanediol, and 7.5%-18.9% deionized water.

Application of the solvent-based etchant may be followed by isopropyl alcohol rinse and $N_2$ dry. Citric acid, which is a diluted weak acid, is utilized so that etching occurs slowly, while deionized water is added to the solution to induce slight level of corrosion. The density and viscosity of 1,3 propanediol is approximately 1.06 g/cm3 and 52 cP, respectively. Accordingly, the solvent-based etchant improves the frictional force between metal film and etchant by 6% and lowers the Reynolds number, which is an indicative of the level of laminar flow (lower Re, more laminar), by ~51 times, compared to aqueous etchants. The solvent-based etchant also provides near perfect selectivity to most trench materials and their liners (i.e., WN and TiN). In order to achieve stable recess rate, the pH and temperature of the solution should be controlled throughout the process.

Figure 5A:
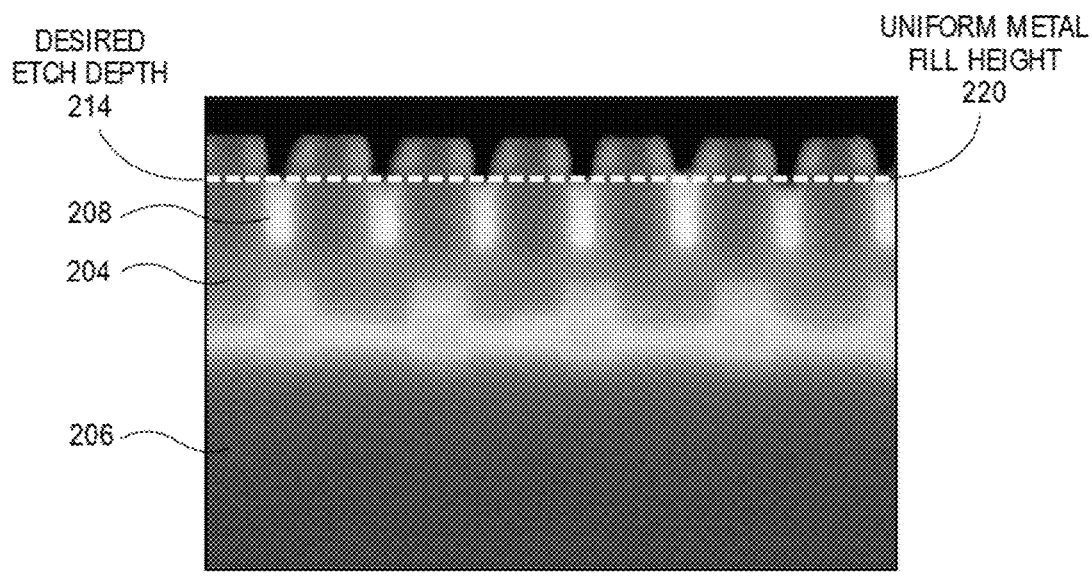
FIG. 5A is SEM cross-section image of a metal alloy fill in open structures that has been recessed using the solvent-based etchant of the disclosed embodiments during fabrication of high aspect ratio metal alloy interconnects.

FIG. 5A is SEM cross-section image of a metal alloy fill in open structures that has been recessed using the solvent-based etchant of the disclosed embodiments during fabrication of high aspect ratio, metal alloy interconnects. Open structures, such as trenches, are shown in dielectric layer 204 over a substrate 206 that have been filled with a metal alloy 208, and then recessed using the solvent-based etchant to remove voids. The solvent-based etchant lowers metal fill surface roughness by 42% compared to the conventional process shown in FIG. 4A, while providing reliable within-wafer uniformity and controllable recess depth. Use of the solvent-based etchant results in relatively uniform metal alloy fill heights 220 and reduced surface roughness, which prevents potential shorts created from non-uniform metal alloy fill.

Figure 5B:
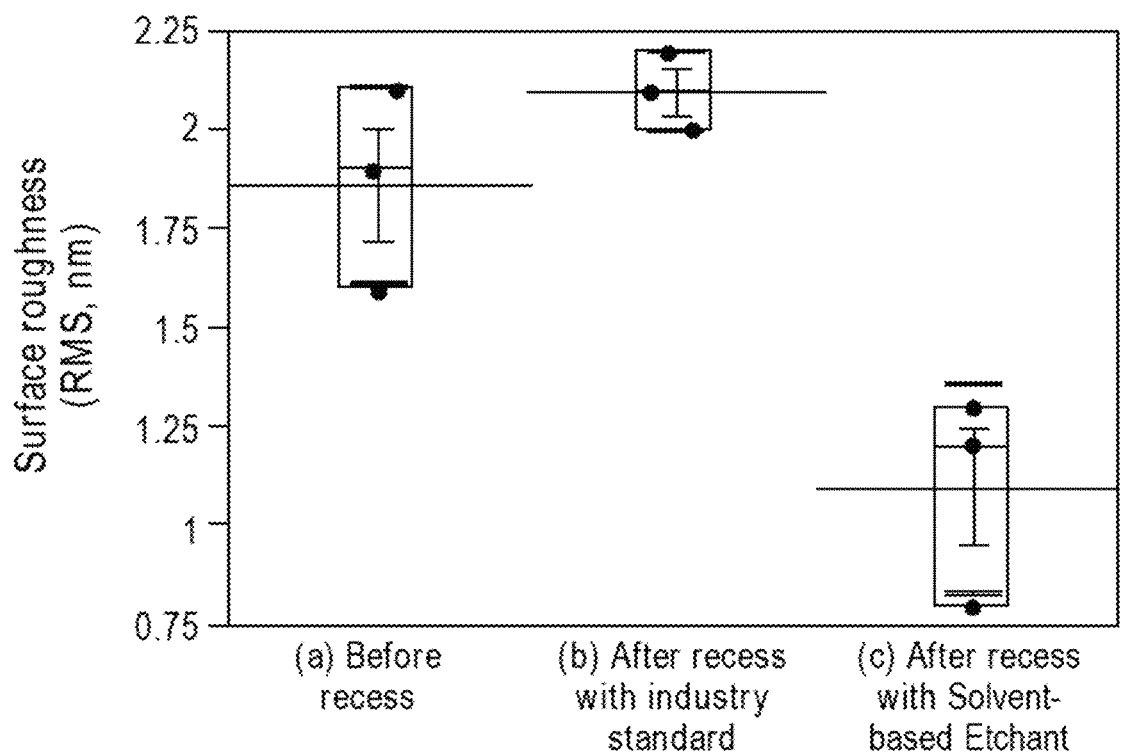
FIG. 5B is a graph comparing metal fill surface roughness as measured by atomic force microscopy (AFM) (a) before recess; (b) after recess with industry standard wet etchant of citric acid and peroxide; and (c) after recess with the solvent-based etchant of the disclosed embodiments.

FIG. 5B is a graph comparing metal fill surface roughness as measured by atomic force microscopy (AFM) (a) before recess; (b) after recess with industry standard wet etchant of citric acid and peroxide; and (c) after recess with the solvent-based etchant of the disclosed embodiments. As shown, the solvent-based etchant results in a recessed metal alloy surface roughness less than 1.25 RMS per nm, which is comparable to surface roughness of a metal surface after CMP. The surface roughness is significantly less than the surface roughness when the metal alloys are etched with industry standard wet etchants, which is above 2 RMS. Surface smoothness of the metal alloy surface is important so that the subsequent metal alloy fill (see FIG. 3F) does not result in void formation. In one embodiment, the current approach can be extended to etch different fill materials, such as metal, if appropriate.

Referring again to FIG. 5A, etching with the solvent-based etchant is timed to recess the metal alloy 208 to a desired etch depth 214, and the process time can be adjusted to accommodate a variety of target metal fill depths. There is a correlation between recess depth and the solvent-based etchant processing time. In some embodiments, example processing times of the solvent-based etchant may range from 90 seconds to 150 seconds, which results in an increasingly larger recess depths.

In a further embodiment, with smooth metal alloy fill surfaces, an ILD or a capping material comprising a conductive metal oxides can be deposited uniformly on the metal alloy fill in the open structures creating an intact seal. In one embodiment, the conductive metal oxides are selected from the group comprising TiO, $TiO_2$, ZrO, $ZrO_2$, $TaO_2$. The advantage of using a conductive metal oxide as an ILD rather than a nitride is that a conductive metal oxide has a lower resistivity than a nitride so the RC value is higher. As a result, the conductive metal oxide reduces ILD resistance without doping, which is creates a porous material. Also with the conductive metal oxides, the ILD can be made taller so the effective value of metal fill is higher, i.e., higher aspect ratios, without sacrificing performance in terms of RC.

The integrated circuit structures described herein may be included in an electronic device. As an example of one such apparatus, FIGS. 6A and 6B are top views of a wafer and dies that include one or more void-free high aspect ratio metal alloy interconnects fabricated with a solvent-based etchant, in accordance with one or more of the embodiments disclosed herein.

Figure 6B:
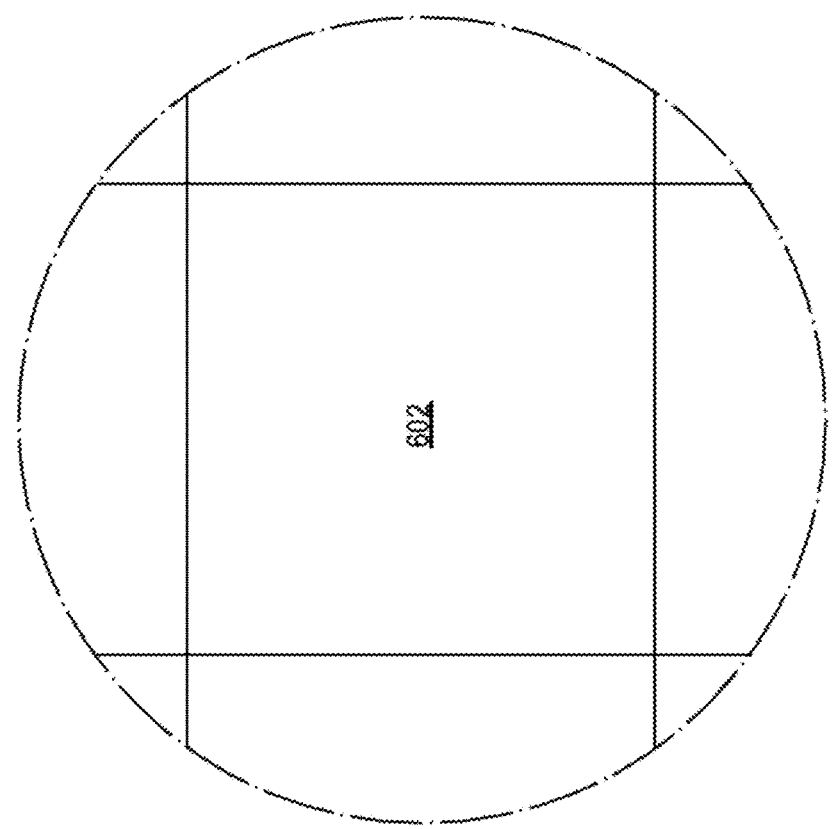
FIGS. 6A and 6B are top views of a wafer and dies that include one or more void-free high aspect ratio metal alloy interconnects fabricated with a solvent-based etchant, in accordance with one or more of the embodiments disclosed herein.
Figure 6A:
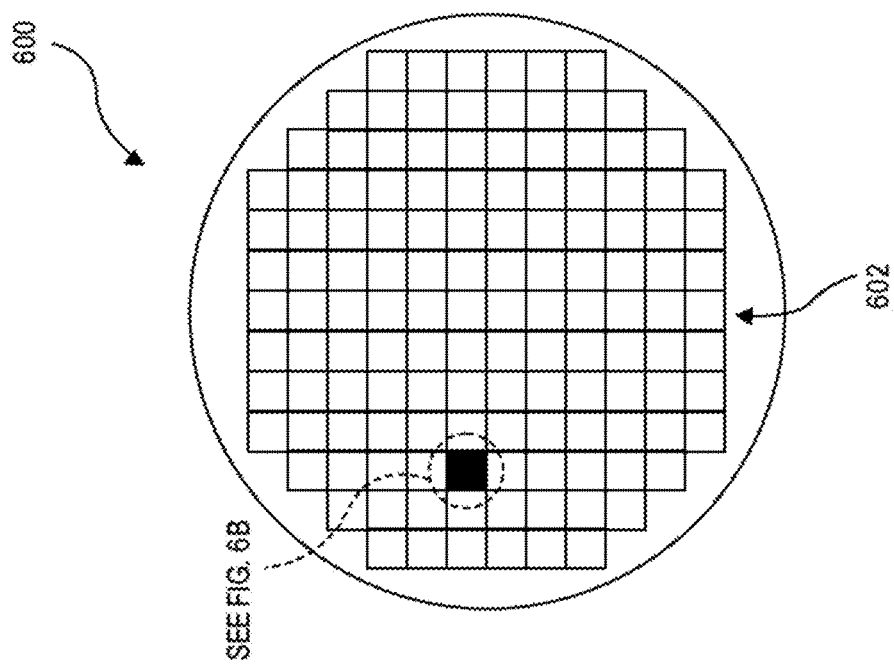

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more integrated circuit s, such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more embedded non-volatile memory structures based independently scaled selectors and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
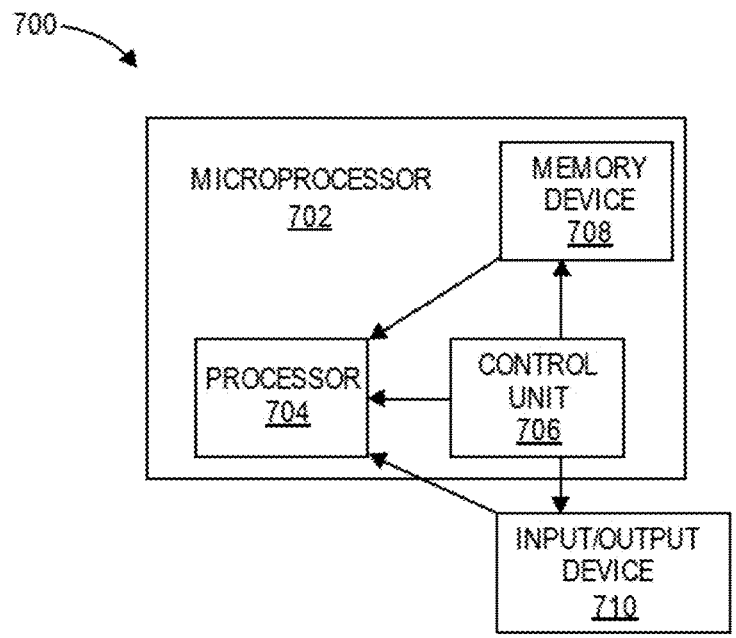
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more void-free high aspect ratio metal alloy interconnects fabricated with a solvent-based etchant, such as those described herein.

Figure 8:
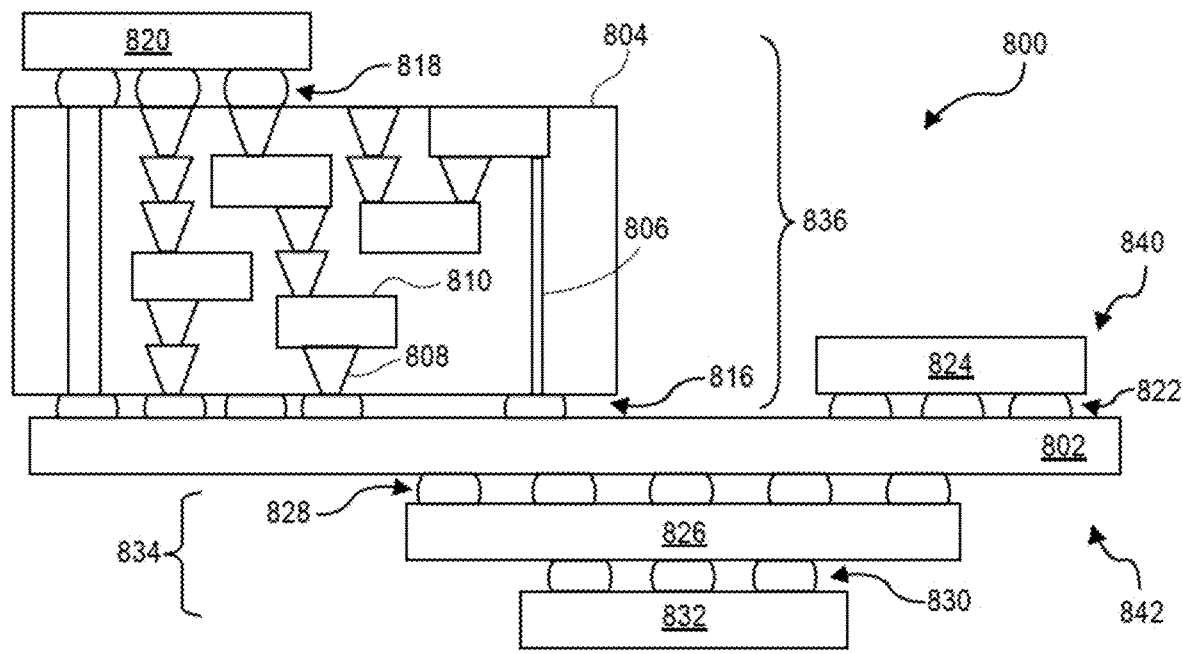
FIG. 8 is a cross-sectional side view of an integrated circuit (IC) device assembly that may include one or more void-free high aspect ratio metal alloy interconnects fabricated with a solvent-based etchant, in accordance with one or more of the embodiments disclosed herein.

FIG. 8 is a cross-sectional side view of an integrated circuit (IC) device assembly that may include one or more void-free high aspect ratio metal alloy interconnects fabricated with a solvent-based etchant, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of void-free high aspect ratio metal alloy interconnects fabricated with a solvent-based etchant, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 702 of FIG. 7B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
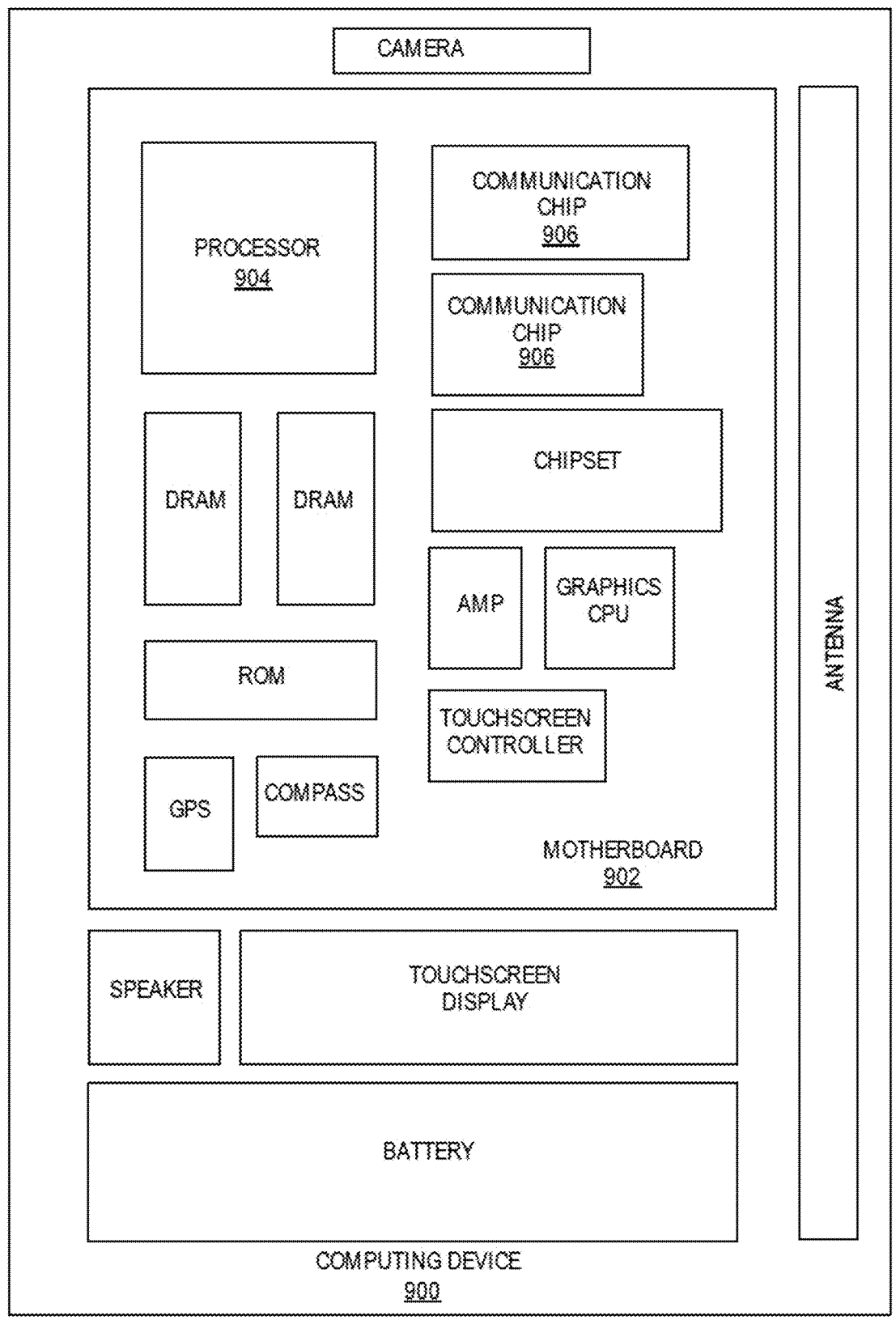
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more void-free high aspect ratio metal alloy interconnects fabricated with a solvent-based etchant, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more void-free high aspect ratio metal alloy interconnects fabricated with a solvent-based etchant, in accordance with implementations of embodiments of the disclosure.

In further implementations, another component housed within the computing device 900 may contain an integrated circuit die that includes one or more void-free high aspect ratio metal alloy interconnects fabricated with a solvent-based etchant, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include void-free high aspect ratio metal alloy interconnects fabricated with a solvent-based etchant. The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure comprises a dielectric layer on a substrate. An open structure is in the dielectric layer, and a void-free metal-alloy interconnect is formed in the open structure, wherein the void-free metal-alloy interconnect comprise a metal-alloy comprising a combination of two or more metallic elements excluding any mixing effects of a seed layer or liner deposited in the open structure prior to a metal fill material, and excluding effects of any doping material on the metal fill material.

Example embodiment 2: The integrated circuit structure of example embodiment 1, wherein the metal-alloy comprises 50-90% of a base metal and 10-50% of a second metal element.

Example embodiment 3: The integrated circuit structure of example embodiment 1 or 2, wherein the metal-alloy is selected from a group comprising nickel-cobalt, nickel-tungsten, and cobalt-tungsten alloys.

Example embodiment 4: The integrated circuit structure of example embodiment 1, 2 or 3, wherein the metal-alloy is selected from a group comprising nickel, cobalt, tungsten, ruthenium, molybdenum, vanadium, chromium Example embodiment 5: The integrated circuit structure of example embodiment 1, 2, 3 or 4, wherein the open structure has an aspect ratio of at least 5-1.

Example embodiment 6: The integrated circuit structure of example embodiment 1, 2, 3, 4 or 5, wherein the open structure comprises one of a trench and a via.

Example embodiment 7: The integrated circuit structure of example embodiment 6, wherein the trench and has an aspect ratio of 5-1 to 7-1.

Example embodiment 8: The integrated circuit structure of example embodiment 6, wherein the via and has an aspect ratio of 12-1 to 20-1 and an opening having a critical dimension less than 50 nm.

Example embodiment 9: A method of fabricating an integrated circuit comprises a) forming a first dielectric layer above a substrate; b) patterning the first dielectric layer to form a first series of high aspect ratio open structures; c) depositing a metal alloy in the open structures, where in due to the high aspect ratio of the open structures voids are formed in the metal alloy; d) planarizing the metal alloy to a top surface of the dielectric layer; e) recessing the metal alloy to a portion of a height of the open structures using a selective etchant to remove the voids; and f) refilling the open structures with the metal alloy to form a first series void free metal alloy interconnects.

Example embodiment 10: The method of example embodiment 9, further comprising forming a second dielectric layer over the first void free metal alloy interconnects and repeating steps b) through f) to create a second series of second void free metal alloy interconnects over the first series of void free metal alloy interconnects.

Example embodiment 11: The method of example embodiment 9 or 10, further comprising selecting the metal-alloy from a group comprising nickel, cobalt, tungsten, ruthenium, molybdenum, vanadium, chromium.

Example embodiment 12: The method of example embodiment 9, 10 or 11, further comprising forming the solvent-based etchant to comprise approximately 1.0%-2% citric acid, 0.1%-0.5% peroxide, 80%-90% 1,2 propanediol or 1,3 propanediol, and 7.5%-18.9% deionized water.

Example embodiment 13: The method of example embodiment 9, 10, 11 or 12, further comprising patterning the open structure to have an aspect ratio of at least 5-1.

Example embodiment 14: The method of example embodiment 9, 10, 11 or 12 further comprising patterning the open structure to include trenches and vias.

Example embodiment 15: The method of example embodiment 14, further comprising patterning the trenches to have an aspect ratio of 5-1 to 7-1.

Example embodiment 16: The method of example embodiment 14, further comprising patterning the vias to have an aspect ratio of 12-1 to 20-1.

Example embodiment 17: The method of example embodiment 16, further comprising patterning the vias to have a critical dimension less than 50 nm.

Example embodiment 18: The method of example embodiment 9, 10, 11, 12, 13, 14, 15, 16 or 17, further comprising etching the recessed metal alloy to a roughness of less than 1.25 RMS per nm.

Example embodiment 19: The method of example embodiment 9, 10, 11, 12, 13, 14, 15, 17 or 18, further comprising processing the solvent-based etchant from 90 seconds to 150 seconds.

Example embodiment 20: The method of example embodiment 9, 10, 11, 12, 13, 14, 15, 16, 17, 18 or 19, wherein the refilling the open structures with the metal alloy further comprises planarizing the refilled open structures.

Example embodiment 21: The method of example embodiment 9, 10, 11, 12, 13, 14, 15, 16, 17, 18, 19 or 20, further comprising substituting a metal for the metal alloy.

Example embodiment 22: The method of example embodiment 10, 11, 12, 13, 14, 15, 16, 17, 18, 19, 20 or 21, wherein forming the second dielectric layer over the first void free metal alloy interconnects further comprises: selecting a material for the second dielectric layer from the group of TiO, TiO2, ZrO, ZrO2, TaO2.

Example embodiment 23: An etchant comprising: approximately 1.0%-2% citric acid, 0.1%-0.5% peroxide, 80%-90% 1,2 propanediol or 1,3 propanediol, and 7.5%-18.9% deionized water.

Example embodiment 24: The etchant of example embodiment 23, wherein the etchant is used to etch a metal alloy used as an interconnect in an integrated circuit.

Example embodiment 25: The etchant of example embodiment 24, wherein the interconnect has an aspect ratio of at least 5-1.

What is claimed is:

1. An integrated circuit structure, comprising:
   a dielectric layer on a substrate;
   an open structure in the dielectric layer, the open structure having an aspect ratio of at least 5-1;
   a void-free metal-alloy interconnect formed in the open structure, wherein the void-free metal-alloy interconnect comprise a metal-alloy comprising a combination of two or more metallic elements excluding any mixing effects of a seed layer or liner deposited in the open structure prior to a metal fill material, and excluding effects of any doping material on the metal fill material.

2. The integrated circuit structure of claim 1, wherein the metal-alloy comprises 50-90% of a base metal and 10-50% of a second metal element.

3. The integrated circuit structure of claim 1, wherein the metal-alloy is selected from a group comprising nickel-cobalt, nickel-tungsten, cobalt-tungsten, and nickel-cobalt-tungsten.

4. The integrated circuit structure of claim 1, wherein the metal-alloy is selected from a group comprising nickel, cobalt, tungsten, ruthenium, molybdenum, vanadium, chromium.

5. The integrated circuit structure of claim 1, wherein the open structure comprises one of a trench and a via.

6. The integrated circuit structure of claim 5, wherein the trench and has an aspect ratio of 5-1 to 7-1.

7. The integrated circuit structure of claim 5, wherein the via and has an aspect ratio of 12-1 to 20-1 and an opening having a critical dimension less than 50 nm.

* * * * *